US011398775B2

(12) United States Patent
Bürkert et al.

(10) Patent No.: US 11,398,775 B2
(45) Date of Patent: Jul. 26, 2022

(54) DEVICE FOR EFFICIENT DC LINK PROCESSING INDEPENDENT OF GRID TYPE

(71) Applicant: ebm-papst Mulfingen GmbH & Co. KG, Mulfingen (DE)

(72) Inventors: Martin Bürkert, Doerzbach-Hohebach (DE); Fabian Schneider, Rot am See (DE); Alex Schneider, Künzelsau (DE); Fabian Wagner, Oberkessach (DE); Steffen Hanselmann, Ilshofen (DE)

(73) Assignee: ebm-papst Mulfingen GmbH & Co. KG, Mulfingen (DE)

( * ) Notice: Subject to any disclaimer, the term of this patent is extended or adjusted under 35 U.S.C. 154(b) by 7 days.

(21) Appl. No.: 16/997,514

(22) Filed: Aug. 19, 2020

(65) Prior Publication Data
US 2021/0159783 A1    May 27, 2021

(30) Foreign Application Priority Data
Nov. 21, 2019    (DE) .......................... 102019131410.0

(51) Int. Cl.
*H02M 1/42*    (2007.01)
*G01R 19/165*    (2006.01)

(52) U.S. Cl.
CPC .... *H02M 1/4216* (2013.01); *G01R 19/16547* (2013.01); *H02M 1/4233* (2013.01)

(58) Field of Classification Search
CPC .............. H02M 1/4216; H02M 1/4233; G01R 19/16547
See application file for complete search history.

(56) References Cited

U.S. PATENT DOCUMENTS

| | | | | |
|---|---|---|---|---|
| 2010/0296321 | A1* | 11/2010 | Sakakibara | H02M 7/125 363/61 |
| 2014/0104901 | A1* | 4/2014 | Nguyen | H02M 1/44 363/48 |
| 2016/0049889 | A1* | 2/2016 | Schneider | H02P 6/28 318/400.3 |
| 2017/0063219 | A1* | 3/2017 | Hyodo | H02M 1/34 |
| 2019/0288539 | A1 | 9/2019 | Vela Garcia | |
| 2020/0295669 | A1* | 9/2020 | Spesser | B60L 53/16 |
| 2020/0412238 | A1* | 12/2020 | Zhu | H02M 1/4233 |
| 2021/0288575 | A1* | 9/2021 | Liu | B60L 53/22 |

FOREIGN PATENT DOCUMENTS

| | | |
|---|---|---|
| DE | 4305768 A1 | 9/1994 |
| DE | 3525877 | 1/1997 |
| FR | 29201211 A1 | 3/2009 |

(Continued)

OTHER PUBLICATIONS

European Search Report dated Jan. 11, 2021.
(Continued)

*Primary Examiner* — Harry R Behm
(74) *Attorney, Agent, or Firm* — Dickinson Wright PLLC

(57) ABSTRACT

The disclosure relates to the operation and a circuit arrangement for a network connection variable with regard to the input voltage (1-phase/3-phase), which is connected using a centre tap (M) between the capacitors (C) via a connecting line to a neutral conductor (N) of an input AC voltage source.

14 Claims, 4 Drawing Sheets

(56) References Cited

FOREIGN PATENT DOCUMENTS

WO  WO2018092012      5/2018
WO     2019186078 A  10/2019

OTHER PUBLICATIONS

German Search Report dated Dec. 18, 2019.
Zhang, Y., et al., "Leakage Current Mitigation of Non-lsolated Integrated Chargers for Electric Vehicles," IEEE, 2019, pp. 1195-1201.
Kwon, Y., et al., "Line Current Improvement of Three-phase Four-wire Vienna Rectifier Using Dead-Beat Control," IEEE, 2017, pp. 49-54.

\* cited by examiner

DEVICE FOR EFFICIENT DC LINK PROCESSING INDEPENDENT OF GRID TYPE

RELATED APPLICATIONS

This application claims priority to German Patent Application No. 10 2019 131 410.0, filed Nov. 21, 2019, the entire contents of which are incorporated herein by reference in their entirety.

FIELD

The present disclosure relates to efficient DC link processing, independent of grid type, with simultaneous reduction of the harmonic components in the input current, i.e., to the usability and/or applicability in different supply grids, in particular in one-phase and three-phase grids.

BACKGROUND

Different concepts are known from the prior art to implement the DC link processing in different types of supply grids.

Thus, for example, a multiphase rectifier bridge circuit for a one-phase input is known from EP 0696838 B1. EP 3324535 B1 relates to an electronically commutated fan system.

A motor drive power conversion system is known from EP 3509212 A1, including a filter circuit having a single inductance and a capacitor for each input phase, an active rectifier having silicon carbide rectifier switching devices, a DC link circuit having a film DC link capacitor, an inverter, and a controller to operate the rectifier switching devices at a PWM rectifier switching frequency of 10 kHz or more.

Furthermore, an AC-DC converter having PFC is known from U.S. Pat. No. 2,007,004 0516 A1, which provides a constant output voltage at an arbitrary predetermined value (no matter whether less or more than the input line peak voltage or even equal to the input line peak voltage) using an input line AC voltage having broad voltage range (typically sinusoidal 110 VAC, 60 Hz or 220 VAC, 50 Hz).

However, the systems known from the prior art display at least one of the disadvantages or problems mentioned hereafter, which are to be improved or remedied:
a) excessively high harmonic distortion of the intake current;
b) processing of the DC link voltage independent of the type of grid not possible;
c) no possibility of providing the DC link voltage level in dependence on the load;
d) asymmetrical load of the grid phases;
e) no option of reducing the electronic variance;
f) high tool costs and/or development costs for design and production;
g) high storage costs because of the manifold variants.

BRIEF SUMMARY

The disclosure is therefore based on the object of overcoming the above-mentioned disadvantages and providing a cost-effectively producible solution, using which an efficient DC link processing independent of the type of grid is implementable, in particular with a reduction of the harmonic distortion in the input current.

This object is achieved by the combination of features according to patent claim 1.

One basic concept in this case is to design a concept having a variable grid connection of a 3-phase PFC topology in such a way that an adaptation of the control is possible, so that the rotary-phase current-PFC topology may also be used for a 1-phase grid connection at equal output power.

According to the disclosure, a circuit arrangement is proposed for this purpose for a grid connection variable with respect to the input voltage (1-phase/3-phase) comprising a 3-phase PFC stage, the centre tap of which between the capacitors is connected via a connecting line to a neutral conductor of the input AC voltage source. This circuit topology has the property in a 1-phase grid mode of doubling the rectified voltage to subsequently set it to the voltage level to be regulated.

The 3-phase mode at the phases (L1, L2, L3) of the input AC voltage source takes place in this case in a first circuit topology and the 1-phase mode takes place by interconnecting the phase terminals (L1, L2, L3) in a parallel circuit and also preferably further modification of the circuit, as described in the following preferred embodiment variants.

The mentioned circuit arrangement thus in principle comprises switchover means and/or adaptation means for the production as intended of a topology for a 3-phase mode and alternatively the 1-phase mode.

Such means consist of the two diodes and the two capacitors connected in series. The voltage source is then placed between the two diodes and on the centre tap of the capacitors. Due to this interconnection, the positive half-wave of the grid charges the upper capacitor and the negative half-wave charges the lower capacitor. The doubled rectified supply voltage is thus applied over both capacitors.

In one exemplary design, it is provided that a switch is provided in the connecting line between the voltage doubler circuit and the neutral conductor connection to be able to alternately disconnect or close the connection for a switchover from a 1-phase into a 3-phase mode.

Furthermore, it is advantageously provided that a voltage analysis unit is provided between the input AC voltage source and the PFC stage and the switching state (open/closed) of the above-mentioned switch is controlled by the voltage analysis unit.

In a further exemplary design of the disclosure, it is provided that in the 3-phase mode, the three phase connections (L1, L2, L3) are each connected to one of the inputs of the PFC stage, while in the 1-phase mode, the three phase connections (L1, L2, L3) are connected to one another and are connected via a centre tap of the capacitors via said connecting line to the neutral conductor connection for connection to the neutral conductor of the AC input voltage source.

The switchover means provided for this purpose for producing the connection mentioned in the previous paragraph can be performed via a cable, a wire bridge, or a connecting line, attached for this purpose, either manually or automatically by analyzing the input voltage, for which the input voltage is analyzed for the automation and if a 1-phase supply is detected, the centre tap of the capacitors is connected to the N conductor via an electrical switch/relay. In contrast, if a 3-phase supply is detected, the switch remains open.

It is furthermore advantageous if an EMC filter adaptable in the filter characteristic is provided before the PFC stage, the adaptation of the filter characteristic of which, depending on 1-phase or 3-phase mode, is preferably implemented via multiple current compensation chokes.

In one exemplary design of the disclosure, the 3-phase PFC stage is designed as a Vienna rectifier. However, other PFC stages may also be implemented (as shown hereafter in the description of the exemplary embodiments).

Six diodes and one electric switch can be provided in each line branch of the PFC stage, and also the parallel capacitors connected thereto in series, between which the centre tap is formed, which is connected or connectable to the neutral conductor of the input AC voltage source.

In one exemplary design of the disclosure, it is provided that a branch having two further diodes connected in series is provided in each line branch of the PFC stage in parallel to the rectifier diodes to implement the 1-phase mode and is connected between the diodes to the neutral conductor, while the further above-mentioned centre tap between the capacitors then cannot be connected to the neutral conductor via the connecting line and the centre tap in each case, however. The voltage doubling is intentionally prevented by this procedure, to also be able to commutate consumers having lesser voltage regulations.

BRIEF DESCRIPTION OF THE DRAWINGS

Other advantageous refinements of the disclosure are characterized in the dependent claims and/or are described in greater detail hereafter together with the description of the preferred embodiment of the disclosure on the basis of the figures.

In the figures.

DETAILED DESCRIPTION

The disclosure is explained in greater detail hereafter with reference to the figures, wherein identical reference signs in the different exemplary embodiments indicate identical structural and/or functional features.

Figure 1:
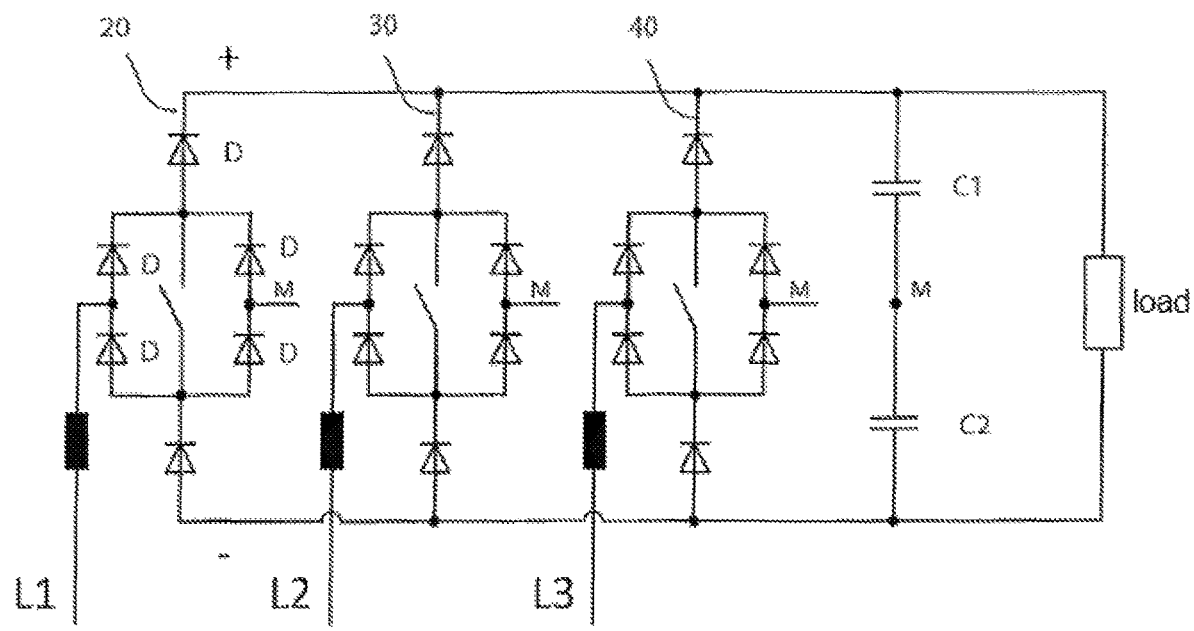
FIG. 1 shows a circuit topology of a Vienna rectifier as a PFC stage for implementing a first exemplary embodiment of a circuit according to the disclosure.

Firstly, an exemplary circuit topology of a Vienna rectifier as a PFC stage for implementing a first exemplary embodiment of a circuit 1 according to the disclosure is shown in FIG. 1. The Vienna rectifier consists in this case of three branches 20, 30, 40, namely one line branch for each phase L1, L2, L3. One line branch 20, 30, 40 is implemented in each case from six diodes D and one electrical switch Sz (e.g., MOSFET, IGBT, . . . ). The centre tap M is connected over capacitors C1, C2 connected in series. By suitable clocking of the electrical switches Sz, the capacitors C1, C2 having centre tap M are symmetrically charged, so that a synchronous sinusoidal current can be taken from the grid.

Figure 2:
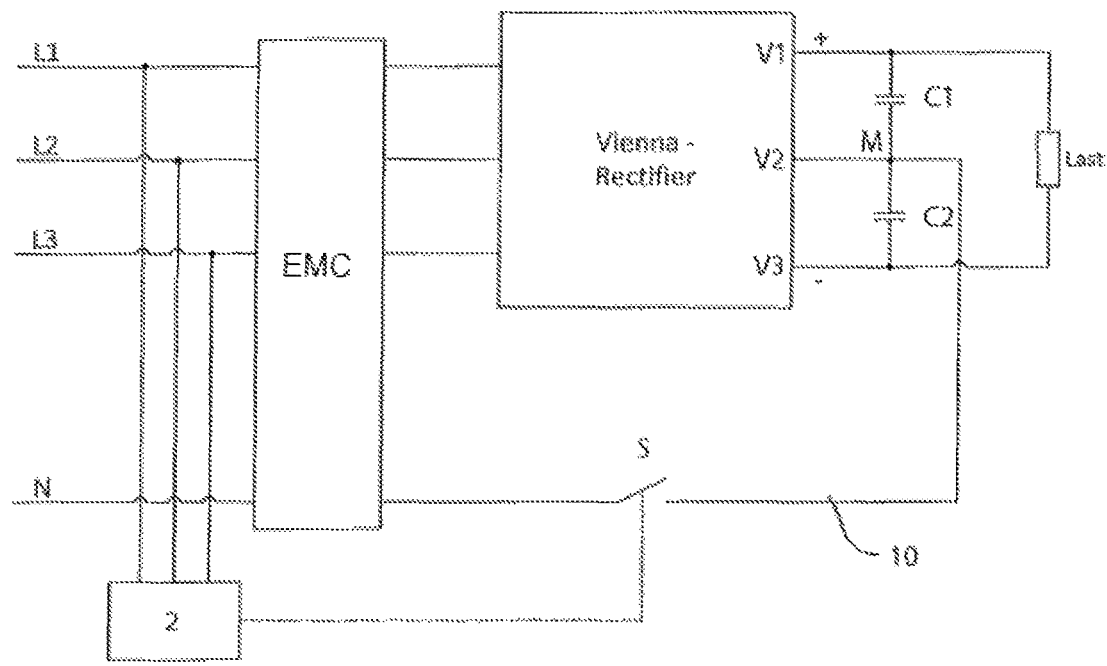
FIG. 2 shows a schematic view which illustrates the basic concept of the disclosure.

FIG. 2 shows a schematic view, which illustrates the basic principle of the disclosure. The phase connections L1, L2, L3 and the neutral conductor connection N can be seen on the left in the figure. The 3-phase PFC stage (as a Vienna rectifier here) is formed located behind them, the outputs V1, V2, V3 of which are connected to the two capacitors C1, C2, wherein the centre tap M is connected to the output V2 of the PFC stage and this centre tap M between the capacitors C1, C2 is connected via a connecting line 10 to the neutral conductor connection N of an input AC voltage source. Furthermore, the connection of an exemplary load is shown.

A switch S is provided in the connecting line 10. Furthermore, a voltage analysis unit 2 is provided between the input AC voltage source or the connections L1, L2, L3 and N and the PFC stage. The switching state (open/closed) of the switch S is controlled by the voltage analysis unit 2.

An EMC filter (EMC) adaptable in the filter characteristic, the filter characteristic of which is preferably implemented via current compensation chokes, is located before the PFC stage. For this purpose, one or more 4-phase current compensation chokes are used, depending on the filter stage. In the 3-phase mode, they act like a 3-phase current compensator, since the N conductor is then not connected. In the 1-phase mode, these three windings are energized in parallel. The total current then flows back via the fourth winding in the N conductor.

Figure 3:
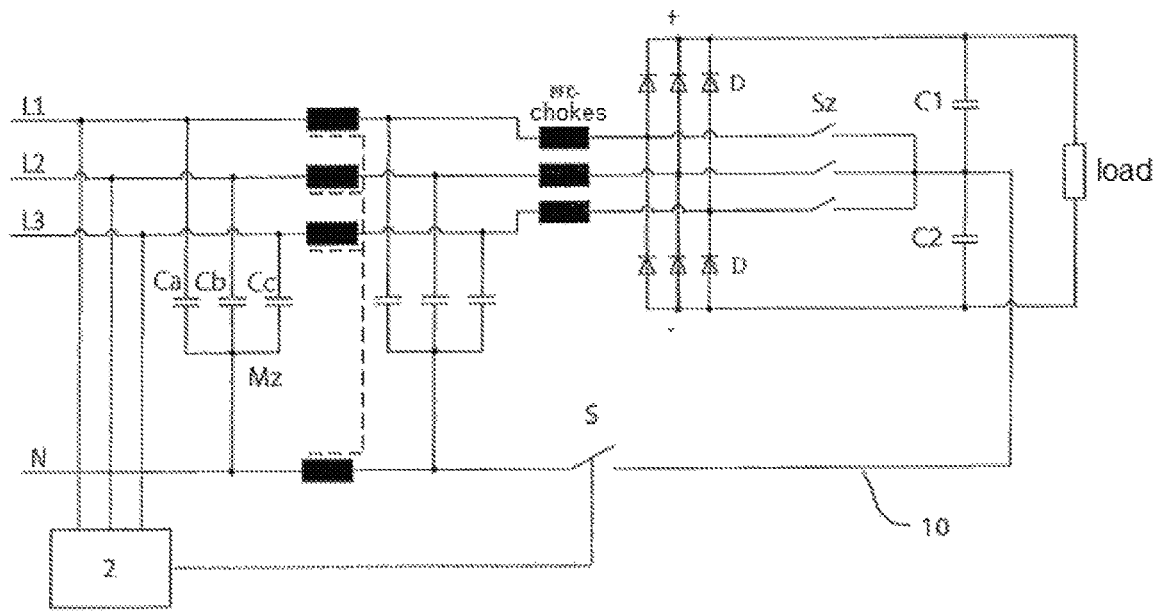
FIG. 3 shows an alternative exemplary embodiment of a circuit according to the disclosure.

An exemplary embodiment of a circuit according to the disclosure is found in FIG. 3. In principle, the PFC stage shown is constructed using six diodes D and three electronic switches Sz. The switches Sz are directly connected to the centre tap M in this topology.

Figure 4:
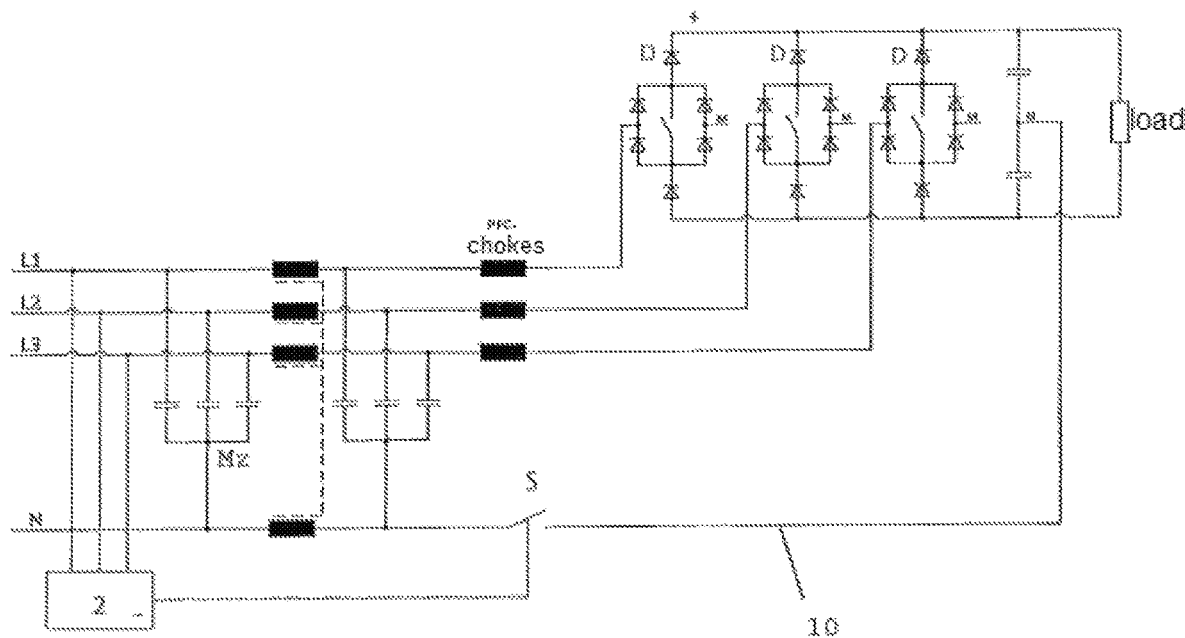
FIG. 4 shows a further alternative exemplary embodiment of a circuit according to the disclosure.
Figure 5:
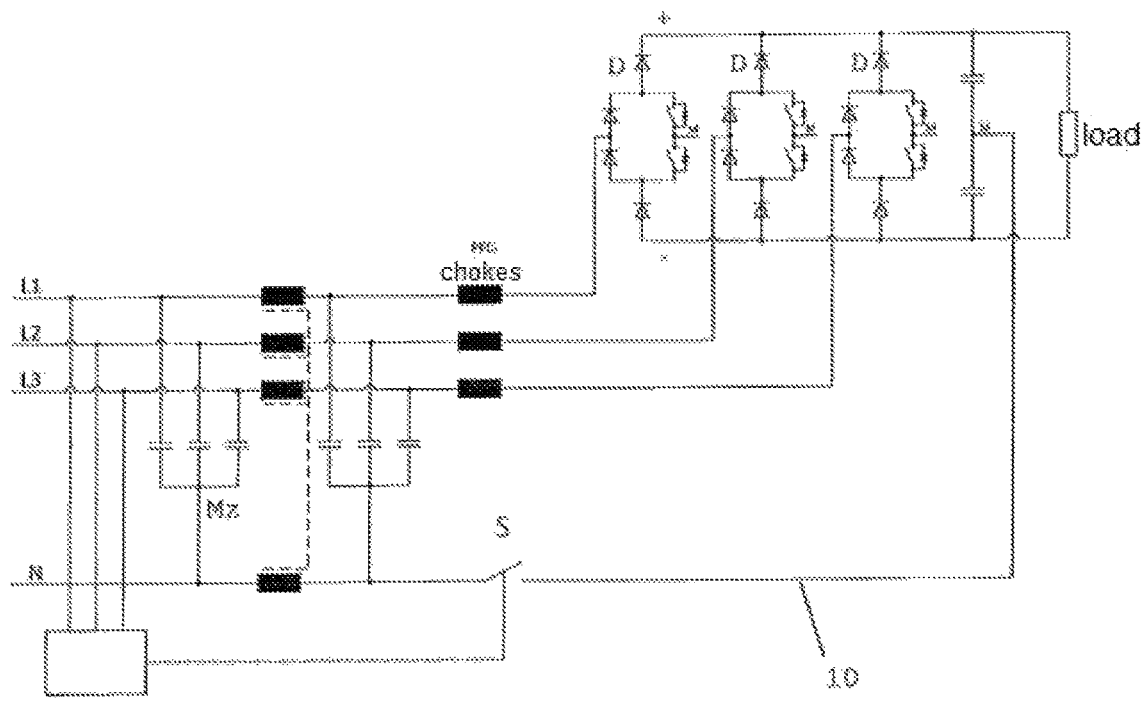
FIG. 5 shows a further alternative exemplary embodiment of a circuit according to the disclosure.
Figure 6:
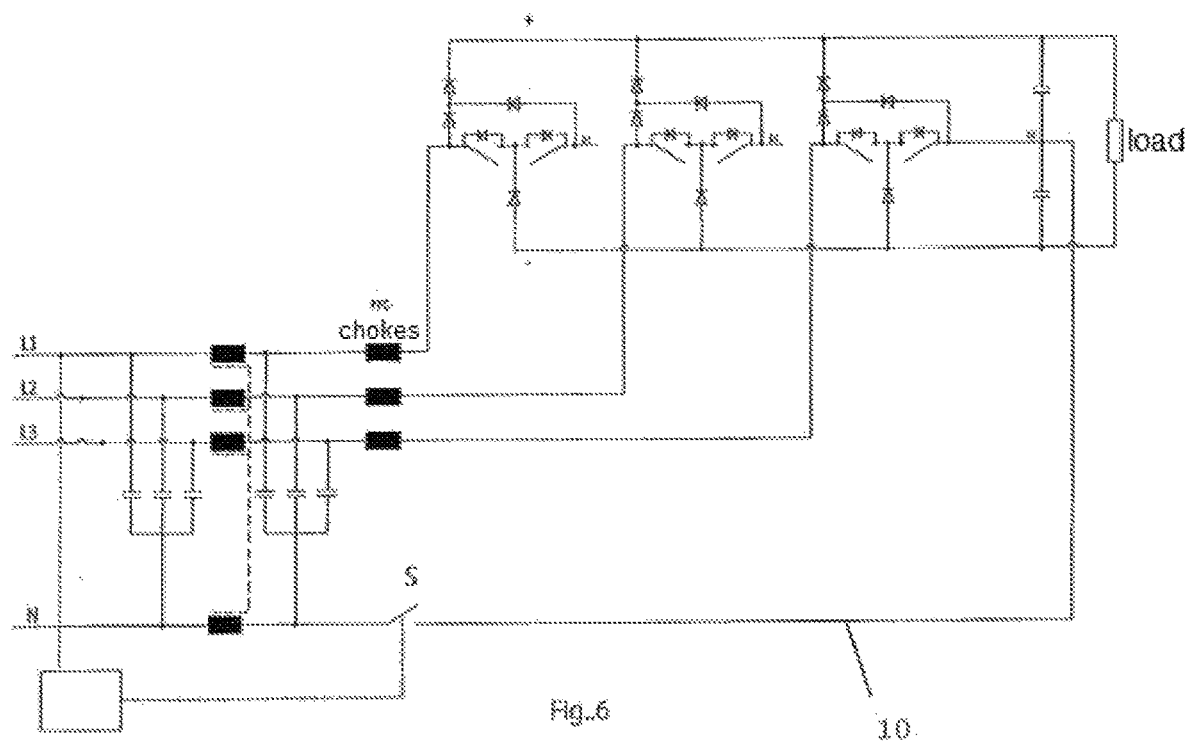
FIG. 6 shows a further alternative exemplary embodiment of a circuit according to the disclosure.

The basic function of the switches Sz may be implemented by different embodiments as described hereafter. The following topologies of FIGS. 4 to 6 are shown as examples.

Figure 7:
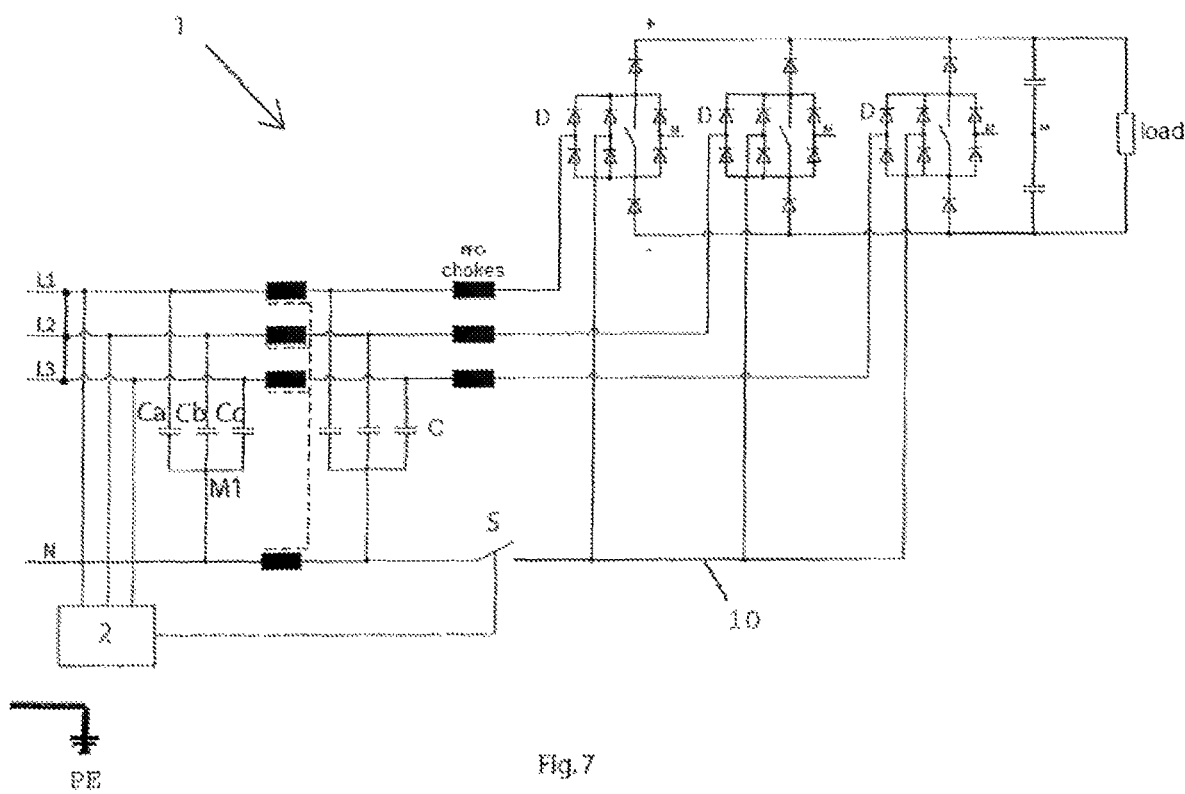
FIG. 7 shows a further alternative exemplary embodiment of a circuit according to the disclosure without voltage doubling.

It is explained in the embodiment of FIG. 7 how the 1-phase mode is preferably implemented. For this purpose, the three phase connections L1, L2, L3 are connected to one another using the three capacitors Ca, Cb, Cc. The centre tap is identified by M1. The connecting line 10 is connected in this case to the neutral conductor N of the AC input voltage source. In contrast, if voltage doubling is not supposed to occur in the one-phase mode, the circuit also has to be adapted using additional diodes according to FIG. 7. Two further diodes per branch are required for this purpose. They are connected in parallel to the already provided rectifier diodes. The neutral conductor N is not on the capacitor centre tap between the capacitors C1 and C2 here, but rather on the respective common connection Mz.

The disclosure is not restricted in its embodiment to the above-specified preferred exemplary embodiments. Rather, a number of variants is conceivable, which make use of the described solution even in fundamentally different embodiments.

The invention claimed is:

1. A circuit arrangement for a network connection variable with regard to the input voltage, comprising a 3-phase PFC stage, capacitors (C) and a centre tap (M) between the capacitors (C) and connected via a connecting line to a neutral conductor (N) of an input AC voltage source, wherein three phase connections (L1, L2, L3) are each connected to the PFC stage via three line branches, and wherein six diodes (D) and one electrical switch are provided in each line branch, and also parallel capacitors (C1, C2) connected in series thereto, between which the centre tap (M) is formed and connected to the neutral conductor (N) of the input AC voltage source via the connecting line, wherein, in a 3-phase mode, the three phase connections (L1, L2, L3) are each connected to the PFC stage, while in a 1-phase mode, the three phase connections (L1, L2, L3) are connected to one another in a parallel circuit via three capacitors (Ca, Cb, Cc) and are connected via a second centre tap (M1) of the parallel circuit via the connecting line to the neutral conductor (N) of the AC input voltage source.

2. The circuit arrangement as claimed in claim 1, wherein a switch (S) is provided in the connecting line.

3. The circuit arrangement as claimed in claim 2, wherein a voltage analysis unit is provided between the input AC voltage source and the PFC stage, and a switching state of the switch (S) is controlled by the voltage analysis unit between an open state and a closed state.

4. The circuit arrangement as claimed in claim 1, wherein establishment of a connection is performed via a cable, a wire bridge, or a connecting line, attached for the establishment of the connection, either manually or automatically by analysis of the input voltage.

5. The circuit arrangement as claimed in claim 1, wherein an EMC filter (EMC) having an adaptable filter characteristic is provided before the PFC stage, and wherein the filter characteristic is implemented via multiple current compensation chokes.

6. The circuit arrangement as claimed in claim 1, wherein the 3-phase PFC stage represents a Vienna rectifier having diodes arranged in parallel.

7. The circuit arrangement as claimed in claim 1, wherein, to implement a 1-phase mode, a branch having two further diodes connected in series is connected in parallel to rectifier diodes in each line branch of the PFC stage and a centre tap is connected in between, in each case, to the neutral conductor (N), while the centre tap (M) between the capacitors (C) is not connected to the neutral conductor (N) via the connecting line.

8. A circuit arrangement for a network connection variable with regard to the input voltage, comprising:
   a 3-phase PFC stage;
   capacitors (C); and a
   centre tap (M) between the capacitors (C) and connected via a connecting line to a neutral conductor (N) of an input AC voltage source;
   wherein three phase connections (L1, L2, L3) are each connected to the PFC stage via three line branches, and wherein six diodes (D) and one electrical switch are provided in each line branch, and also parallel capacitors (C1, C2) connected in series thereto, between which the centre tap (M) is formed and connected to the neutral conductor (N) of the input AC voltage source via the connecting line,
   wherein, to implement a 1-phase mode, a branch having two further diodes connected in series is connected in parallel to rectifier diodes in each line branch of the PFC stage and a centre tap is connected in between, in each case, to the neutral conductor (N), while the centre tap (M) between the capacitors (C) is not connected to the neutral conductor (N) via the connecting line.

9. The circuit arrangement as claimed in claim 8, wherein a switch (S) is provided in the connecting line.

10. The circuit arrangement as claimed in claim 9, wherein a voltage analysis unit is provided between the input AC voltage source and the PFC stage, and a switching state of the switch (S) is controlled by the voltage analysis unit between an open state and a closed state.

11. The circuit arrangement as claimed in claim 8, wherein, in a 3-phase mode, the three phase connections (L1, L2, L3) are each connected to the PFC stage, while in a 1-phase mode, the three phase connections (L1, L2, L3) are connected to one another in a parallel circuit via three capacitors (Ca, Cb, Cc) and are connected via a second centre tap (M1) of the parallel circuit via the connecting line to the neutral conductor (N) of the AC input voltage source.

12. The circuit arrangement as claimed in claim 11, wherein establishment of a connection is performed via a cable, a wire bridge, or a connecting line, attached for the establishment of the connection, either manually or automatically by analysis of the input voltage.

13. The circuit arrangement as claimed in claim 8, wherein an EMC filter (EMC) having an adaptable filter characteristic is provided before the PFC stage, and wherein the filter characteristic is implemented via multiple current compensation chokes.

14. The circuit arrangement as claimed in claim 8, wherein the 3-phase PFC stage represents a Vienna rectifier having diodes arranged in parallel.

* * * * *